United States Patent
Tsutsui

(10) Patent No.: US 6,958,741 B2
(45) Date of Patent: Oct. 25, 2005

(54) DISPLAY DEVICE

(75) Inventor: Yusuke Tsutsui, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 460 days.

(21) Appl. No.: 10/273,370

(22) Filed: Oct. 18, 2002

(65) Prior Publication Data

US 2003/0085828 A1   May 8, 2003

(30) Foreign Application Priority Data

Oct. 19, 2001   (JP) ............................ 2001-321621

(51) Int. Cl.$^7$ ............................................. G09G 3/36
(52) U.S. Cl. ............................ 345/90; 345/76; 345/98
(58) Field of Search .......................... 345/87–100, 204, 345/76–86

(56) References Cited

U.S. PATENT DOCUMENTS

| | | | |
|---|---|---|---|
| 5,945,972 A | * | 8/1999 | Okumura et al. ............. 345/98 |
| 5,959,598 A | * | 9/1999 | McKnight .................... 345/90 |
| 6,738,005 B2 | * | 5/2004 | Koyama et al. ............... 345/92 |
| 6,747,623 B2 | * | 6/2004 | Koyama ....................... 345/87 |
| 2002/0021274 A1 | * | 2/2002 | Koyama et al. ............... 345/98 |
| 2002/0036604 A1 | * | 3/2002 | Yamazaki et al. ............. 345/76 |
| 2003/0016202 A1 | * | 1/2003 | Edwards et al. ............... 345/98 |

FOREIGN PATENT DOCUMENTS

JP   10-253941   *   9/1998

* cited by examiner

*Primary Examiner*—Regina Liang
(74) *Attorney, Agent, or Firm*—Morrison & Foerster LLP

(57) ABSTRACT

The display device of this invention has two types of DA converter for converting a digital image signal to an analog image signal; a first DA converter disposed in the peripheral area of a plurality of pixel elements and a second DA converter disposed within each of the pixel elements. The first DA converter converts the upper four-bit of a six-bit digital image signal and the second DA converter converts the remaining lower two-bit. This enables the simplification of the peripheral circuits of the pixel element, preventing size increase of the framing area of the display panel, while achieving the multiple-depth display with an increased number of the bits of the DA converter. In the display device with the built-in DA converter, the multiple-bit can be achieved while preventing the increase in the circuit size.

9 Claims, 10 Drawing Sheets

FIG.2

True Value Table

| D5D4D3D2 | Vj, Vj+1 |
|---|---|
| 0000 | $V_0, V_1$ |
| 0001 | $V_1, V_2$ |
| 0010 | $V_2, V_3$ |
| 0011 | $V_3, V_4$ |
| 0100 | $V_4, V_5$ |
| 0101 | $V_5, V_6$ |
| 0110 | $V_6, V_7$ |
| 0111 | $V_7, V_8$ |
| 1000 | $V_8, V_9$ |
| 1001 | $V_9, V_{10}$ |
| 1010 | $V_{10}, V_{11}$ |
| 1011 | $V_{11}, V_{12}$ |
| 1100 | $V_{12}, V_{13}$ |
| 1101 | $V_{13}, V_{14}$ |
| 1110 | $V_{14}, V_{15}$ |
| 1111 | $V_{15}, V_{16}$ |

DISPLAY DEVICE

BACKGROUND OF THE INVENTION

1. Field of the Invention

This invention relates to a display device, especially to a display device with a DA converter that converts a digital image signal to an analog image signal.

2. Related Art

A liquid crystal display device displays an image by supplying an analog image signal to a pixel element electrode of each pixel element and changing the electric field applied to the liquid crystal for the liquid crystal to align itself. The liquid crystal display device with a DA converter that converts a digital image signal inputted from an outside device into an analog image signal has been widely known. This type of liquid crystal display device will be explained by referring to drawings, hereinafter. FIG. 8 shows a circuit diagram of a conventional active matrix liquid crystal display device. In the pixel element area, the pixel elements GS11, GS12, GS13, - - - are disposed in the first column and the pixel elements GS21, GS22, GS23, - - - are disposed in the second column. That is, a plurality of the pixel elements are arranged in a matrix configuration.

Each pixel element has an N-channel type pixel element selection transistor 72 (thin film transistor). Drain signal lines 61, 62, and 63 extending from a horizontal driver circuit 30 are connected respectively to the drain of the pixel element selection transistor 72. Gate signal lines 51, 52, - - - extending from a vertical driver circuit 40 are connected respectively to the gate of the pixel element selection transistor 72.

The configuration of the pixel element GS11 will be explained by referring to FIG. 9. The source 72s of the pixel element selection transistor 72 is connected to a pixel element electrode 80 of a liquid crystal 21. Also, a storage capacitor 85 for holding the voltage of the pixel element electrode 80 for one field period is disposed. One terminal 86 of the storage capacitor 85 is connected to the source 72s of the pixel element selection transistor 72, and the other terminal 87 is provided with a voltage commonly used among the pixel elements. When a gate scanning signal (H level) is applied to the gate signal line 51, the pixel element selection TFT 72 turns on and an analog image signal is transmitted to the pixel element electrode 80 through the drain signal line 61 and retained in the storage capacitor 85. The image signal voltage applied to the pixel element electrode 80 is then applied to the liquid crystal 21. The liquid crystal aligns itself based on the voltage applied, obtaining a liquid crystal display. The configuration of each of the pixel elements is completely the same as that described above.

The configuration of the horizontal driver circuit 30 will be explained hereinafter. Four-bit portion of the digital image signal D0–D3 are supplied from outside. First latch circuits 1—1, 1-2, 1-3, - - - of four-bit configuration for latching the four-bit portion D0–D3 are disposed for each row. These latch circuits 1—1, 1-2, 1-3, - - - consecutively sample the four-bit portion D0–D3 based on sampling pulses SRP1, SRP2, SRP3, - - - and hold the signals for one horizontal period. The sampling pulse SRP1, SRP2, SRP3, - - - are generated by a shift resistors 10, 10, - - - . That is, the shift resistors 10, 10, - - - generate the sampling pulse, which is a pulse consecutively shifted from a horizontal start signal STH, based on a horizontal clock CKH.

The four-bit portion of the digital signal D0–D3 retained in the first latch circuits 1—1, 1-2, 1-3, - - - is simultaneously latched to second latch circuits 2-1, 2—2, 2-3, - - - of four-bit configuration based on a transfer pulse TP generated upon the end of one horizontal period. Then, the signals are outputted to the drain signal lines 61, 62, 63, - - - after converted into analog image signals through DA converters 3-1, 3-2, 3—3, - - - .

Also, the vertical driver circuit 40 outputs a gate pulse, which is a pulse consecutively shifted from a vertical start signal STV (each pulse is at high-level for one horizontal period), to the gate signal lines 51, 52, - - - based on a vertical clock CKV.

As seen from FIG. 10, a decoding circuit is generally used in the DA converter 3-1. The DA converter 3-1 decodes the four-bit portion D0–D3 by using the decoding circuit 90, selects one reference voltage Vj from the 16 reference voltages V0–V15 supplied to sixteen reference voltage lines, and outputs the selected voltage from an output terminal 91. The decoding circuit 90 is configured from a transistor array, to which the four-bit portion of the digital image signal D0–D3 are supplied. For example, when the digital image signal is (0110), all the four transistors in series 93 are on, selectively outputting the reference voltage V6. The configurations of the DA converters 3-2, 3—3, - - - are the same as the configuration described above.

Next, the operation of the liquid crystal display device with the above configuration will be explained by referring to the timing chart of FIG. 11. Although the first-bit digital image signal D0 is used as an example, the operation is exactly the same as in case of the digital image signal of other bits. The digital image signal D0 changes sequentially to the data D00, D01, D02, - - - with the synchronization with the horizontal clock CKH. Therefore, the data D00 is latched to the latch circuit 1—1 based on the sampling pulse SRP1 and the data D01 is latched to the latch circuit 1—1 based on the sampling pulse SRP2.

The digital image signal D0 is latched to the latch circuits 1—1, 1-2, 1-3, - - - , during one horizontal period. Then the data D00, D01, D02, which have been latched to the latch circuits 1—1, 1-2, 1-3, - - - are then simultaneously latched to the latch circuits 2-1, 2—2, 2-3, - - - . The latch data D00, D01, D02 are converted into analog image signal through the DA converters 3-1, 3-2, 3—3, - - - and outputted to the drain signal lines 61, 62, 63, - - - .

As described above, the DA converters 3-1, 3-2, 3—3, - - - are disposed within the horizontal driver circuit 30 located in a peripheral area of the pixel element in the conventional liquid crystal display device. Therefore, the configuration of the peripheral circuits of the pixel element, especially that of the horizontal driver circuit is complicated, leading to the increased size of the framing area of the liquid crystal panel.

Also, since this type of DA converter uses the decoding circuit 90, the numbers of the transistor terminals and the reference lines increase along with the number of the depth. Therefore, it is very difficult to achieve the liquid crystal display device that can accommodate both integration and multiple-depth display simultaneously.

SUMMARY OF THE INVENTION

The display device of this invention has two DA converters for converting a digital image signal to an analog image signal; a first DA converter disposed in the peripheral area of a plurality of pixel elements and a second DA converter disposed within each of the pixel elements. The first DA converter converts an m-bit portion of an n-bit digital image signal and the second DA converter converts a remaining (n–m)-bit portion of the digital image signal.

This enables the simplification of the peripheral circuits of the pixel element, preventing the increased size of the framing area of the display panel. It is also possible to achieve the multiple-depth display by increasing the number of the bits of the DA converter.

One embodiment of the first DA converter and the second DA converter is as follows.

The first DA converter has a reference voltage generating circuit that generates a plurality of reference voltages based on the m-bit portion of the digital image signal and a reference voltage selection circuit that selects a corresponding reference voltage pair from a plurality of the reference voltages based on the m-bit portion of the digital image signal. This is a type of decoding circuit. It is useful because the circuit size stays small as along as the number of the bits is relatively small.

The second DA converter, which makes a pair with the first DA converter, has a ladder resistance circuit that generates a plurality of voltages between the pair of the reference voltages and a voltage selection circuit that selects one voltage from a plurality of the voltages mentioned above based on the (n–m)-bit portion of the digital image signal. This is a ladder resistance type DA converter.

The other type of second DA converter, which makes a pair with the first DA converter, has a plurality capacitors with weighed capacitance value, a voltage supply circuit that selectively supplies the reference voltage pair to the electrodes of a plurality of the capacitors based on the (n–m)-bit portion of the digital image signal, and a charge transfer transistor that supplies the charge accumulated in a plurality of the capacitors to a pixel element electrode based on a timing signal. This is a capacitance type DA converter.

Also, the other type of the first DA converter has a reference data generating circuit that sequentially outputs a reference digital data, which is an n-bit data with increment, a step voltage generating circuit that generates a step voltage pair changing in the synchronization with the change in the reference digital data and corresponding to the reference digital data, an identification detection circuit that outputs an identification detection signal after detecting the identification of the digital image signal data with the reference digital data, and a gate circuit that outputs the step voltage pair based on the identification detection signal.

Since the decoding circuit is not used in this DA converter, the increase in the number of transistors and wirings can be prevented, even if the number of the bits increases. The ladder resistance type DA converter or the capacitance type DA converter described earlier can be directly applied to as the second DA converter, with which the abovementioned first DA converter makes a pair.

BRIEF DESCRIPTION OF THE DRAWINGS

FIG. 2 is a true value table of a reference voltage pair Vj and Vj+1 selected by a reference voltage selection circuit.

DETAILED DESCRIPTION OF THE INVENTION

Figure 1:
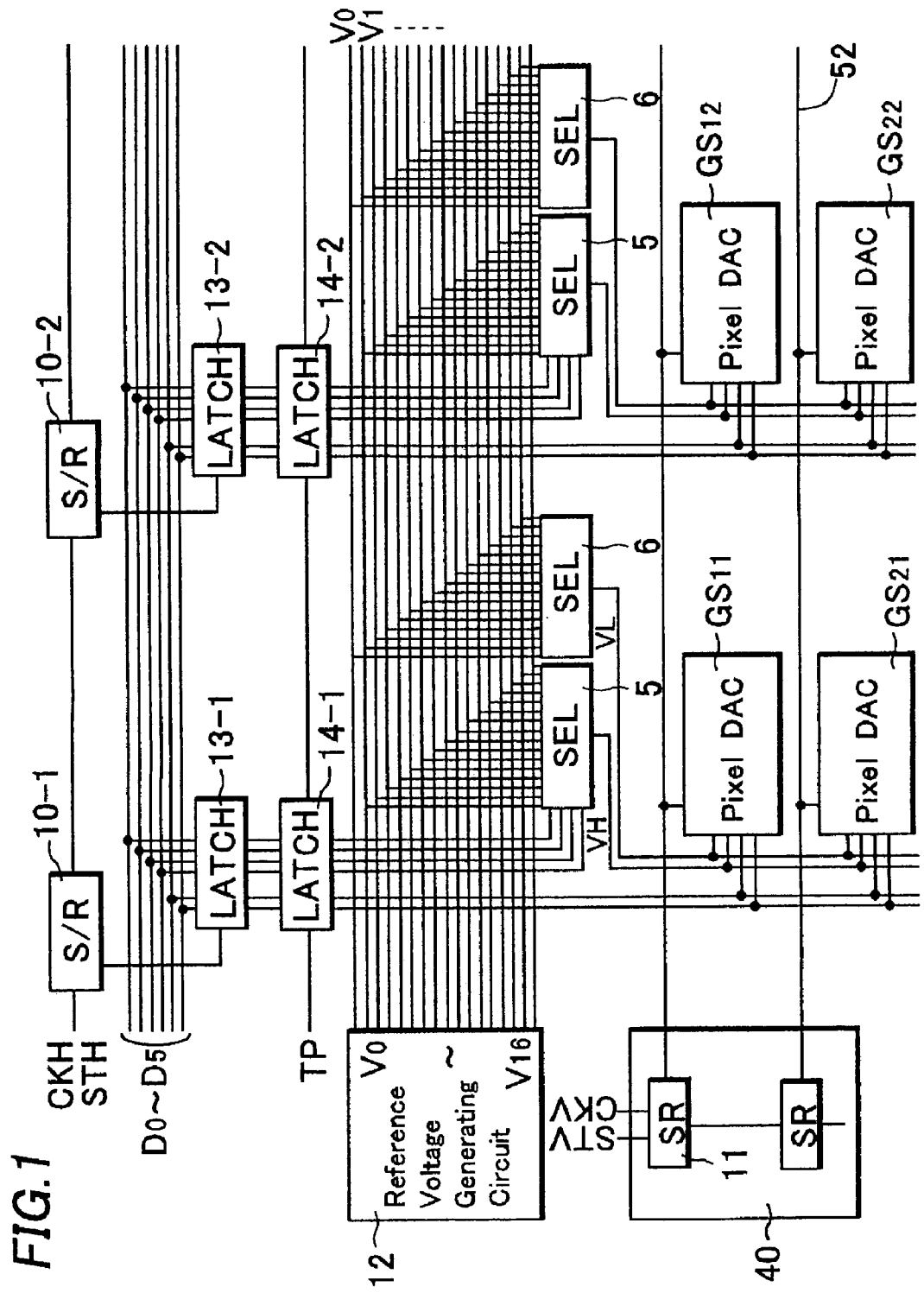
FIG. 1 is the circuit diagram of a display device of a first embodiment of this invention.

Next, a display device of a first embodiment of this invention is explained by referring to figures. FIG. 1 shows a circuit diagram of the display device of the first embodiment of this invention. Only two rows of horizontal driver circuits and two columns and two rows of pixel element portions are shown in the figure for the sake of simplicity. The configuration of a vertical driver circuit 40 is the same as that described above.

A six-bit digital image signal D0–D5 is supplied from outside. First latch circuits 13-1,13-2 with 6-bit configuration sample the digital image signal D0–D5 based on sampling pulses SRP1, SRP2 and hold them for one horizontal period. Shift resistors 10-1, 10-2 generate the sampling pulses SRP1, SRP2. That is, the shift resistors 10-1, 10-2 generate the sampling pulse, which is a pulse sequentially shifted from a horizontal start signal STH, based on a horizontal clock CKH.

The digital image signal D0–D5 retained in the first latch circuits 13-1, 13-2 are then simultaneously latched to second latch circuits 14-1,14-2 with six-bit configuration based on a transfer pulse TP generated upon the end of one horizontal period and converted into analog signals afterwards.

There are two kinds of DA converter; a first DA converter disposed around the peripheral area of a plurality of the pixel elements GS11, GS12, - - - and a second DA converter disposed in each of the pixel elements GS11, GS12, - - - - . The first DA converter converts the upper four-bit portion of the digital image signal of the six-bit digital image signal D0–D5 and the second DA converter converts the remaining two-bit portion of the digital image signal.

The first DA converter has a reference voltage generating circuit 12 that generates seventeen reference voltages V0–V16 corresponding to the four-bit portion of the six-bit digital image signal and a pair of reference voltage selection circuits 5, 6 that selects a reference voltage pair Vj, Vj+1 from the reference voltages V0–V16 based on the four-bit portion of the digital image signal.

Figure 10:
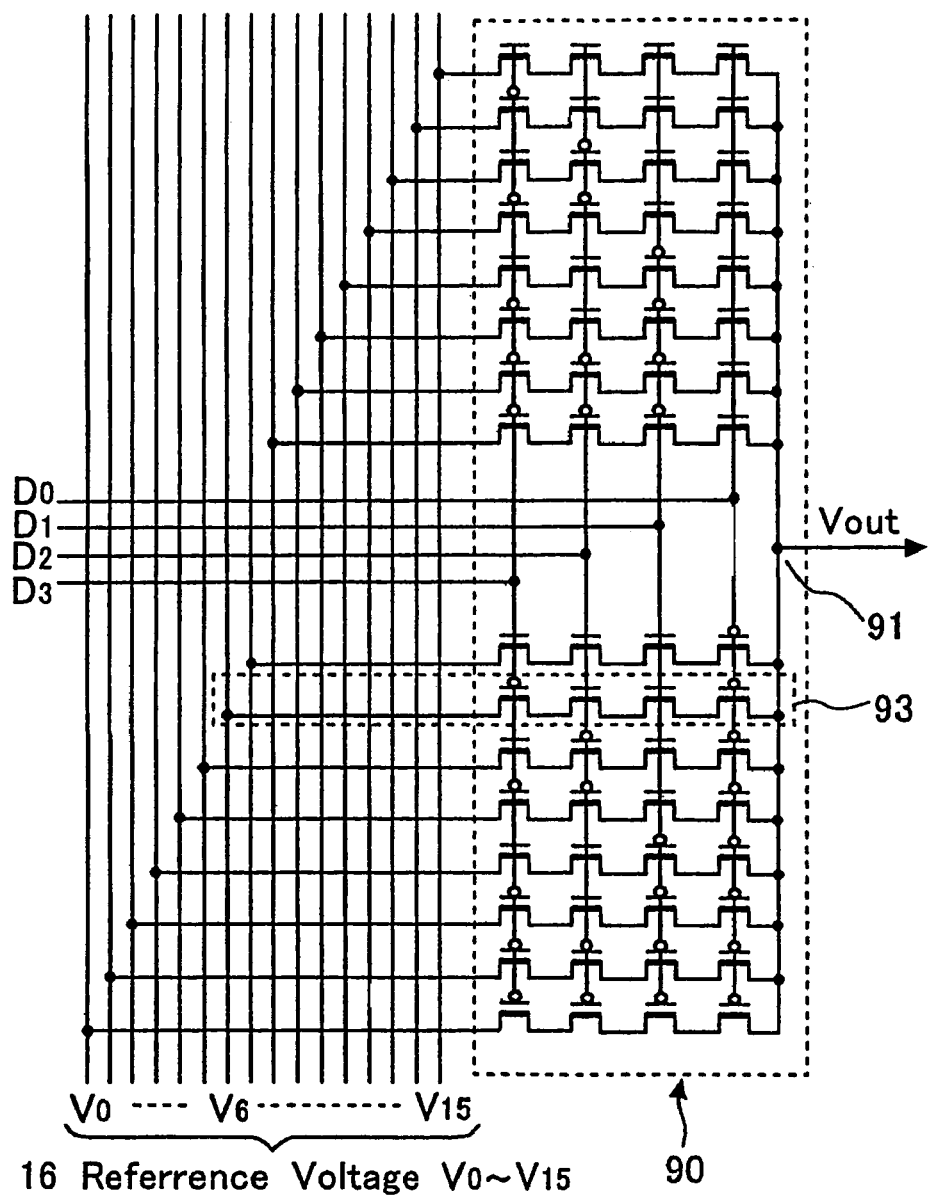
FIG. 10 is a circuit diagram of a DA converter used in the prior art liquid crystal display device.
Figure 10:
Figure 10:

The reference voltage generating circuit 12 can be configured from a ladder resistance connected between, for example, a source voltage Vdd and an earth voltage Vss. FIG. 2 is a true value table of the reference voltage pair Vj, Vj+1 selected by the reference voltage selection circuits 5, 6. Altering the transistor array of the decoding circuit shown in FIG. 10 can easily configure the reference voltage selection circuits 5, 6.

The upper four-bit portion of the digital image signal D2–D5 is converted to the reference voltage pair Vj, Vj+1 (analog voltage pair) based on the true value table. The reference voltage pair Vj, Vj+1 is an adjacent pair selected from seventeen reference voltages V0–V16 and Vj is always smaller than Vj+1 (Vj<Vj+1). Therefore, the reference voltage pair Vj, Vj+1 selected by the reference voltage selection circuits 5, 6 will be referred to as a voltage pair VL and VH hereinafter.

Figure 3A:
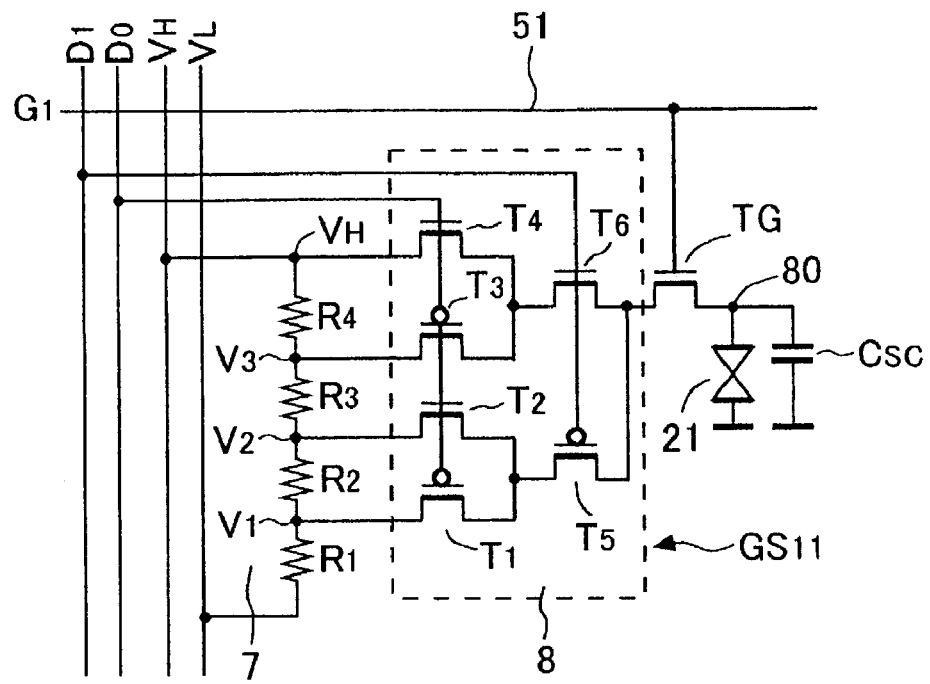
FIG. 3A is the circuit diagram showing a pixel element GS11 of the liquid crystal display device with a second DA converter.
Figure 3B:
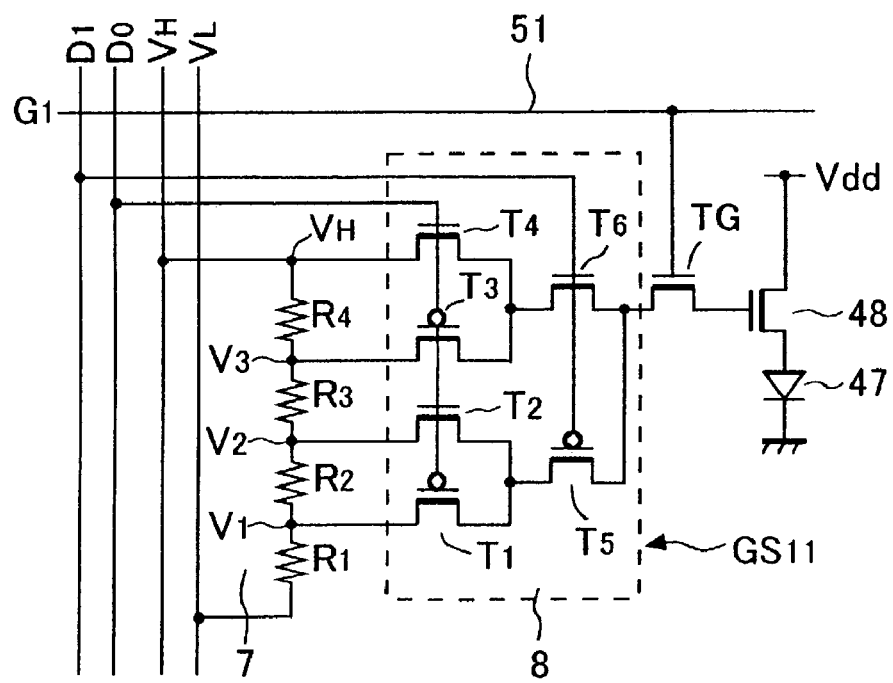
FIG. 3B is a circuit diagram showing a pixel element of an electro luminescence display device.

The second DA converter is disposed within each of the pixel elements GS11, GS12, - - - and performs DA conversion on the two-bit portion of the digital image signal, D0 and D1. The configuration of the second DA converter will be explained by referring to FIG. 3A and FIG. 3B. FIG. 3A is the circuit diagram showing the pixel element GS11 of the liquid crystal display device with the second DA converter. Other pixel elements have the same configuration. FIG. 3B is the circuit diagram showing the pixel element of an electro luminescence display device (referred to as an EL display device hereinafter). In the EL display device, an EL element 47 and a driver transistor 48 for electrically driving the EL element 47 are disposed in place of a liquid crystal 21. That is, the analog voltage converted from the digital voltage is applied to the gate of the driving transistor 48. The driving transistor 48 controls the electric current that goes through the EL element based on the analog voltage and thereby the electro luminescence display works. The configuration of the DA converter is the same as that shown in FIG. 3A.

A ladder resistance circuit 7 is configured from resistance elements R1, R2, R3, and R4 connected in series between the voltage pair VL and VH. The voltages VH, V2, V3, and V1 from each of the connection points are inputted to a voltage selection circuit 8. The voltages VH, V2, V3, and V1 can be expressed as follows:

$$V1 = VL + \Delta V \cdot (R1/R)$$

$$V2 = VL + \Delta V \cdot (R1+R2)/R)$$

$$V3 = VL + \Delta V \cdot (R1+R2+R3)/R)$$

where $R = R1+R2+R3+R4$, and $\Delta V = VH-VL$.

When $R1=R2=R3=R4$, $V1=VL+\Delta V/4$, $V2=VL+\Delta V/2$, and $V3=VL+3\Delta V/4$, the voltage increases with the stable rate.

The voltage selection circuit 8 is the circuit selecting one voltage from the abovementioned voltages VH, V2, V3, V1 based on the lower two-bit portion of the digital image signal, D0 and D1. It comprises thin film transistors (TFT) T1, T2, T3 and T4 with the data D0 applied to their gates and the thin film transistors (TFT) T5 and T6 with the dataD1 applied to their gates. Here, T1, T3, and T5 are P-channel type TFTs and T2, T4, and T6 are N-channel type TFTs. That is, when (D0, D1)=(0, 0), T1 and T5 turn on, selectively outputting the voltage V1. When (D0, D1)=(0, 1), T2 and T5 turn on, selectively outputting the voltage V2. When (D0, D1)=(1, 0), T3 and T6 turn on, selectively outputting the voltage V3. And when (D0, D1)= (1, 1), T4 and T6 turn on, selectively outputting the voltage VH.

Therefore, when a pixel element selection transistor TG turns on based on a scanning signal G1, the voltage selected by the voltage selection circuit 8 is applied to a pixel element electrode 80 of the liquid crystal 21. Then, the first and second DA converters with the configurations described above supply the analog voltage corresponding to the six-bit digital image signal D0–D5 to the pixel element electrode 80 of the liquid crystal 21 as well as the gate of the driving transistor 48 though the pixel element selection transistor TG, to form a display image.

As described above, the four-bit portion of the six-bit digital image is converted by the first DA converter disposed in the peripheral area of the pixel element portion and the signals with the remaining two bits are converted by the second DA converter disposed within each of the pixel elements in this embodiment. Therefore, it is possible to achieve the DA conversion of the multiple-bit while preventing the increase in circuit size of the peripheral circuits of the pixel element portion.

Figure 4A:
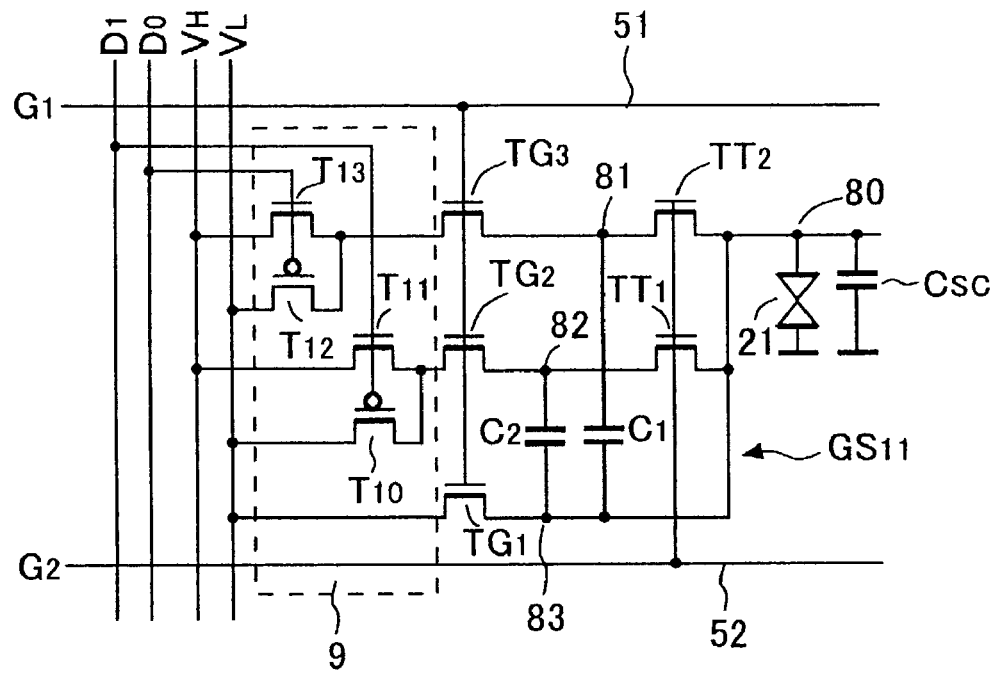
FIG. 4A is a circuit diagram showing the pixel element GS11 of the liquid crystal display device with a built-in second DA converter
Figure 4B:
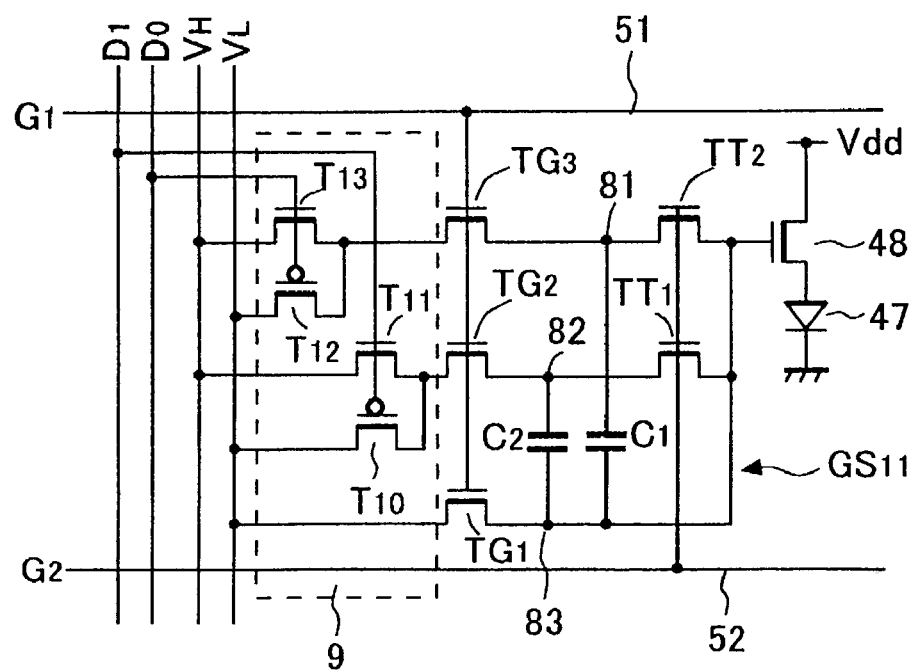
FIG. 4B is a circuit diagram showing a pixel element of the electro luminescence display device.

Next, the configuration of the second DA converter disposed within the pixel element will be explained by referring to FIG. 4A and FIG. 4A. FIG. 4A is the circuit diagram showing the pixel element GS11 of the liquid crystal display device with the built-in second DA converter. Other pixel elements have the same configuration. FIG. 4B is the circuit diagram showing the pixel element of the electro luminescence display device (referred to as the EL display device hereinafter). In the EL display device, the EL element 47 and the driver transistor 48 for electrically driving the EL element 47 are disposed in place of the liquid crystal 21. That is, the analog voltage converted from the digital voltage is applied to the gate of the driving transistor 48. The driving transistor 48 obtains the electro luminescence display by controlling the electric current that goes through the EL element based on the analog voltage. The configuration of the DA converter is the same as that shown in FIG. 4A. Although the explanation will be made only on FIG. 4A, the EL display device shown in FIG. 4B has the same configuration.

A voltage supply circuit 9 has the P-channel thin film transistor (TFT) T10 with its source connected to the voltage VL and its gate provided with the digital image signal D1, the N-channel thin film transistor (TFT) T11 with its source connected to the voltage VH and its gate provided with the digital image signal D1, the P-channel thin film transistor (TFT) T12 with its source connected to the voltage VL and its gate provided with the digital image signal D0, and the N-channel thin film transistor (TFT) T13 with its source connected to the voltage VH and its gate provided with the digital image signal D0. The drains of T10 and T11 are commonly connected to a capacitance electrode 82 of a capacitor C2. And the drains of T12 and T13 are commonly connected to the capacitance electrode 81 of the capacitor C1.

That is, the voltage supply circuit 9 is the circuit selectively supplying the voltage pair VL and VH to the capacitance electrodes 81, 82 of the capacitors C1, C2 with weighed capacitance value based on the two-bit portion of the digital image signal, D0 and D1. The capacitance value of the capacitor C1 is set as C and the capacitance value of the capacitor C2 is set as 2C.

Also, the pixel element selection transistor TG1, which is controlled by the scanning signal G1, is connected between the voltage VL and the other capacitance electrode 83 (commonly used electrode) of the capacitors C1 and C2. Also, the pixel element selection transistor TG2, which is controlled by the scanning signal G1, is disposed between the voltage supply circuit 9 and the capacitance electrode 82. The pixel element selection transistor TG3, which is controlled by the scanning signal G1, is disposed between the voltage supply circuit 9 and the capacitance electrode 81. Charge transfer transistors TT1 and TT2 are also disposed between the pixel element selection transistors TG2, TG3 and the pixel element electrode 80 of the liquid crystal 21 respectively.

The operation of the second DA converter described above will be explained hereinafter. Although the data writing process into the pixel element GS11 will be explained as an example here, the data writing process can be applied to other pixel elements as well.

[When Data D0, D1 is (0, 0)]

When a gate line 51 is selected (the scanning signal G1 is at high-level), TG1, TG2, and TG3 turn on and the voltage of the other electrode 83 of the capacitors C1, C2 becomes the voltage VL. The voltage of the pixel element electrode 80 also becomes VL.

When the data D0, D1=(0, 0) comes from the second latch circuit 14-1, T10 and T12 turn on. Then the voltage of the capacitance electrodes 81, 82 becomes VL.

Then, when the gate line 51 is not selected, TG1, TG2, and TG3 turn off. When the next gate line 52 is selected (the scanning signal G2 is at high-level), the transfer transistors TT1 and TT2 turn on. The charge is divided between the capacitors C1, C2 and the pixel element electrode 80. Therefore, the following equation can be obtained based on the principle of the conservation of the charge.

$$2C \times (VL-VL) + C \times (VL-VL) + VL \times Ctt1 = 2C \times (Vpix-Vpix) + C \times (Vpix-Vpix) + Vpix \times Ctt1$$

Therefore, Vpix=VL.

In the above equations, Vpix is the electrode voltage, and Ctt1=CLC+Csc, where CLC is the capacitance value of the liquid crystal 21 and the Csc is the capacitance value of the parasitic capacitance of the pixel element electrode 80.

[When Data D0, D1 is (1, 0)]

When the gate line 51 is selected (the scanning signal G1 is at high-level), TG1, TG2, and TG3 turn on and the voltage of the other electrode 83 of the capacitors C1, C2 becomes the voltage VL. The voltage of the pixel element electrode 80 also becomes VL.

When the data D0, D1=(1, 0) comes from the second latch circuit 14-1, T10, T13 turn on. The voltage of the capacitance electrode 82 becomes VL and the voltage of the capacitance electrode 81 becomes VH.

Then, when the gate line 51 is not selected, TG1, TG2, and TG3 turn off. When the next gate line 52 is selected (the scanning signal G2 is at high-level), the transfer transistors TT1 and TT2 turn on. The charge is divided between the capacitors C1, C2 and the pixel element electrode 80. Therefore, the following equation can be obtained based on the principle of the conservation of the charge.

$$2C \times (VL-VL) + C \times (VH-VL) + VL \times Ctt1 = 2C \times (Vpix-Vpix) + C \times (Vpix-Vpix) + Vpix \times Ctt1$$

Therefore, Vpix=VL+(VH−VL)×C/Ctt1.

[When Data D0, D1 is (0, 1)]

When the gate line 51 is selected (the scanning signal G1 is at high-level), TG1, TG2, and TG3 turn on and the voltage of the other electrode 83 of the capacitors C1, C2 becomes the voltage VL. The voltage of the pixel element electrode 80 also becomes VL.

When the data D0, D1=(0, 1) comes from the second latch circuit 14-1, T11, T12 turn on. The voltage of the capacitance electrode 82 becomes VH and the voltage of the capacitance electrode 81 becomes VL.

Then, when the gate line 51 is not selected, TG1, TG2, and TG3 turn off. When the next gate line 52 is selected (the scanning signal G2 is at high-level), the transfer transistors TT1 and TT2 turn on. The charge is divided between the capacitors C1, C2 and the pixel element electrode 80. Therefore, the following equation can be obtained based on the principle of the conservation of the charge.

$$2C \times (VH-VL) + C \times (VL-VL) + VL \times Ctt1 = 2C \times (Vpix-Vpix) + C \times (Vpix-Vpix) + Vpix \times Ctt1$$

Therefore, Vpix=VL+(VH−VL)×2C/Ctt1.

[When Data D0, D1 is (1, 1)]

When the gate line 51 is selected (the scanning signal G1 is at high-level), TG1, TG2, and TG3 turn on and the voltage of the other electrode 83 of the capacitors C1, C2 becomes the voltage VL. The voltage of the pixel element electrode 80 also becomes VL.

When the data D0, D1=(1, 1) comes from the second latch circuit 14-1, T11, T13 turn on. The voltage of the capacitance electrode 82 becomes VH and the voltage of the capacitance electrode 81 becomes VH.

Then, when the gate line 51 is not selected, TG1, TG2, and TG3 turn off. When the next gate line 52 is selected (the scanning signal G2 is at high-level), the transfer transistors TT1 and TT2 turn on. The charge is divided between the capacitors C1, C2 and the pixel element electrode 80. Therefore, the following equation can be obtained based on the principle of the conservation of the charge.

$$2C \times (VH-VL) + C \times (VH-VL) + VL \times Ctt1 = 2C \times (Vpix-Vpix) + C \times (Vpix-Vpix) + Vpix \times Ctt1$$

Therefore, Vpix=VL+(VH−VL)×3C/Ctt1.

As seen from above equations, when the data increases by [1], the output voltage increases by (VH−VL)×C/Ctt1. Therefore, when Ctt1=4C, the DA conversion can be performed with the voltages with the same increment rate.

Figure 5:
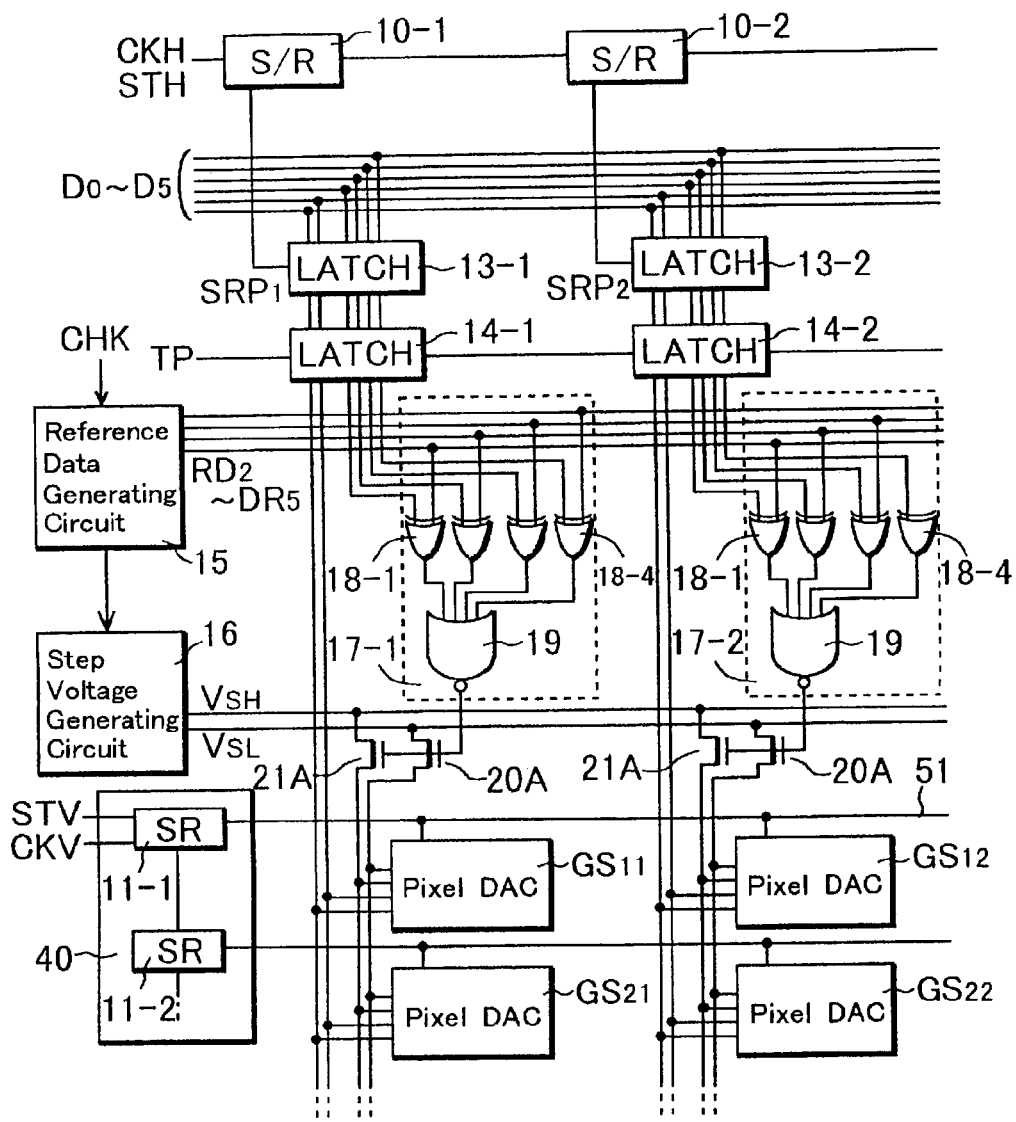
FIG. 5 is the circuit diagram of the display device showing a second embodiment of this invention.

Next, the display device of the second embodiment of this invention is explained by referring to the figures. FIG. 5 shows a circuit diagram of the display device of the second embodiment of this invention. Only two rows of horizontal driver circuits and two columns and two rows of pixel element portions are shown in the figure for the sake of simplicity. The configuration of the vertical driver circuit 40 is the same as that described above.

This embodiment differs from the first embodiment in the configuration of the first DA converter. Other features of the first embodiment can be directly applied to this embodiment. The first DA converter comprises a reference data generating circuit 15, a step voltage generating circuit 16, an identification detection circuit 17, and N-channel type gate transistors 20A, 21A (gate circuit), as seen from FIG. 5.

The reference data generating circuit 15 is a type of counter circuit. The reference data generating circuit adds the increment to the four-bit reference digital data RD2–RD5 starting from the initial value of (0 0 0 0) till the value reaches the maximum of (1 1 1 1), based on standard clock CLB, then sequentially outputs the reference digital data RD2–RD5 during one horizontal period. Upon the start of the next horizontal period, the value is reset to the initial value of (0 0 0 0) and the reference data generating circuit outputs the data till it reaches the maximum value of (1 1 1 1). The operation described above is repeated periodically.

The standard clock CKB is made by dividing the frequency of the horizontal clock CKH, in such way that the number of the clocks generated during one horizontal period is the same as the number of the reference digital data (number of the depth).

The step voltage generating circuit 16 generates a step voltage pair VSL, VSH (analog voltage) corresponding to the reference digital data RD2–RD5, which are sequentially outputted with increment from the reference data generating circuit 15. The step voltage pair VSH, VSH is generated based on the true value table shown in FIG. 2. For example, when RD2–RD5=0000, the step voltage pair (VSL, VSH)=(V0, V1) and when RD2–RD5=0001, the step voltage pair (VSL, VSH)=(V1, V2).

Figure 6:
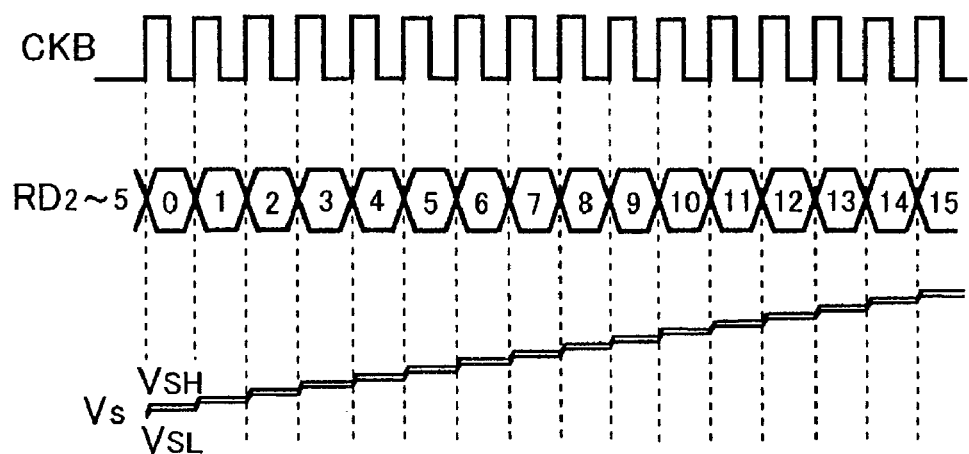
FIG. 6 is a timing chart showing an operation of a step voltage generating circuit.

Also, the change of the step voltage pair VSL, VSH (analog voltage) is synchronized with the change of the reference digital date RD0–RD5 (see FIG. 6). The step voltage generating circuit 16 can be easily configured from, for example, a ladder resistance that generates each of the step voltage VS and a group of switches that make switching for outputting each of the step voltage VS corresponding to the reference digital data RD0–RD5.

Figure 7:
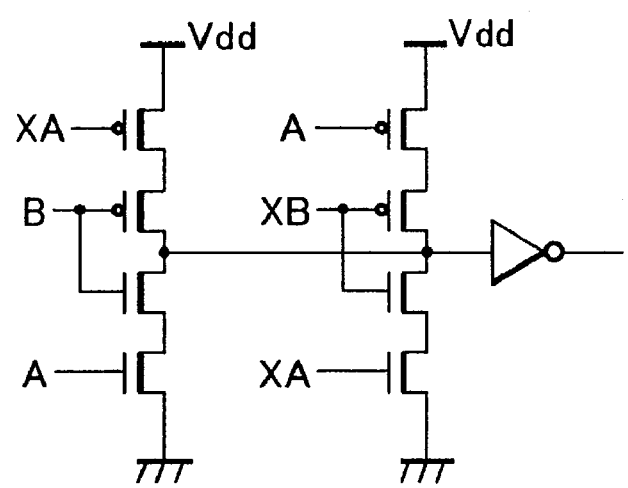
FIG. 7 is a circuit diagram of an exclusive OR circuit.
Figure 8:
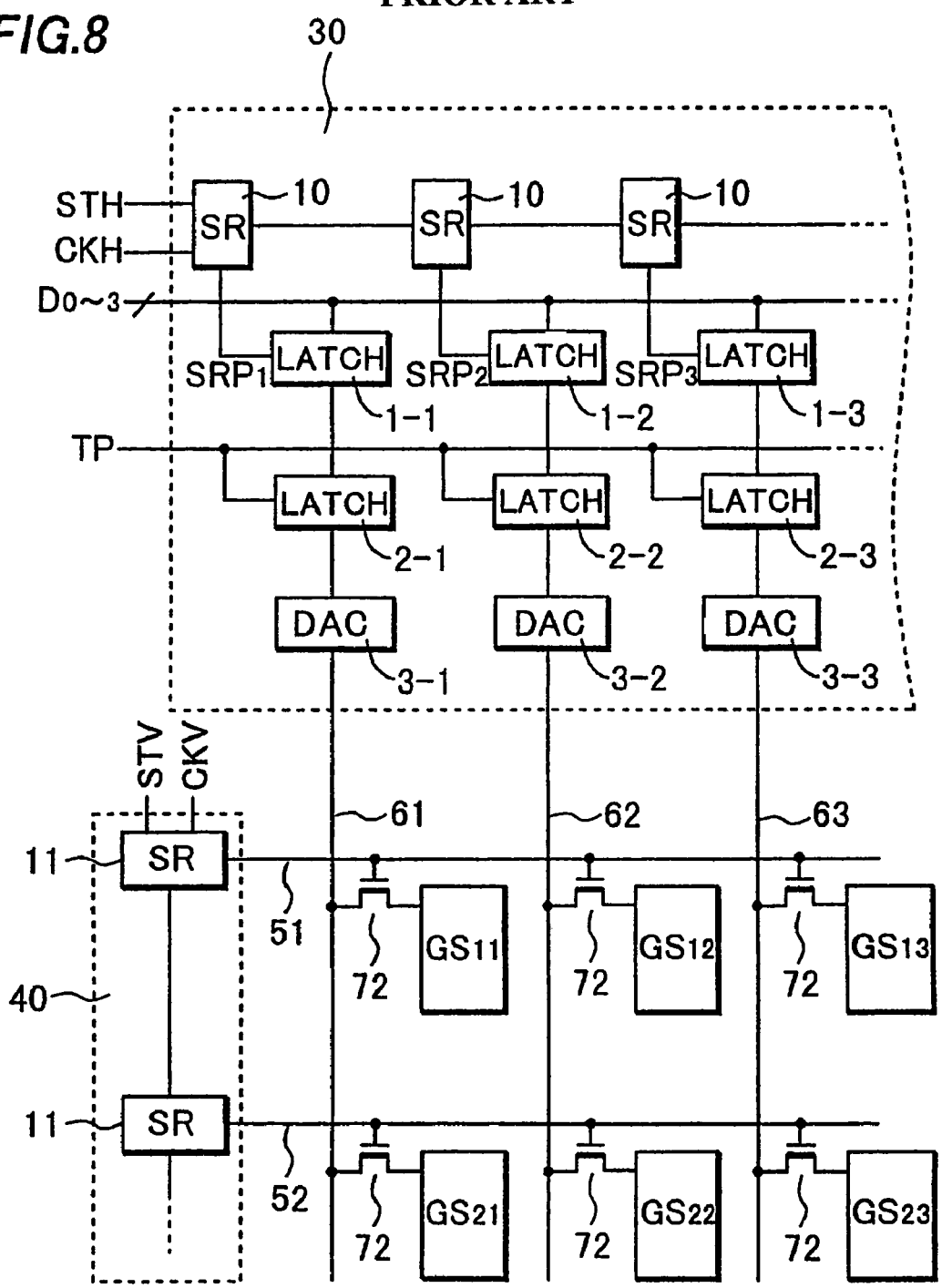
FIG. 8 is a circuit diagram of a liquid crystal display device of prior art.
Figure 9:
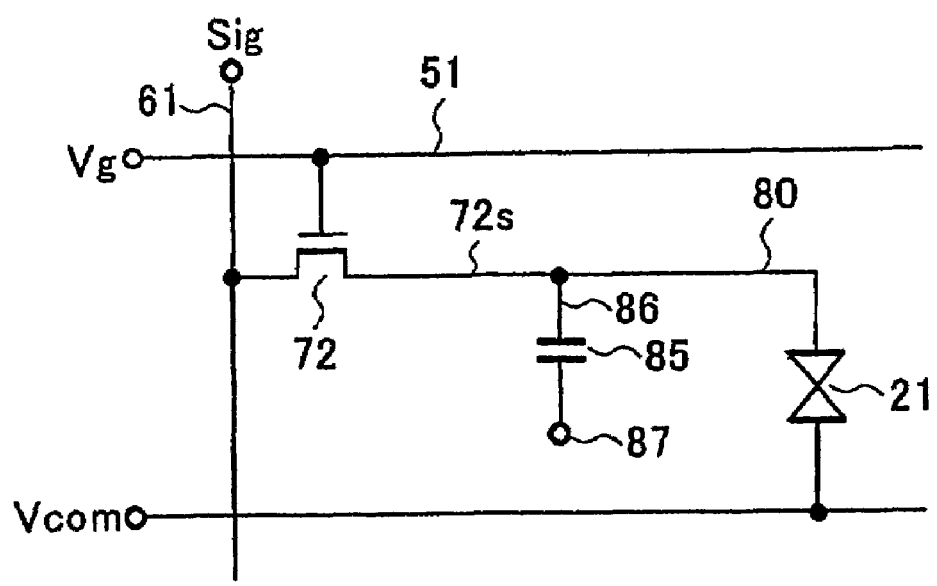
FIG. 9 is a circuit diagram showing a configuration of a pixel element in the prior art liquid crystal display device.

The identification detection circuit 17 is a circuit to detect the identification of the four-bit digital image signal data D2–D5 with the entire corresponding bits of the reference digital data RD2–RD5. It also outputs the identification detection signal. The identification detection circuit 17 can be configured from six exclusive OR circuits 18-1, - - - 18-4 with each bit of the digital image signal data D2–D5 as well as each bit of their corresponding reference digital data RD2–RD5 inputted and a NOR circuit 19 with the outputs of the six exclusive OR circuits 18-1, - - - 18-4 inputted. The exclusive OR circuit can be configured from the circuits shown in FIG. 7. The input data XA is a reversed data of the data A and the input data XB is a reversed data of the data B in FIG. 7.

The exclusive OR circuit 18-1 outputs the logical value of [0] when the digital image signal data D0 is identified with the reference digital data RD0, and outputs the logical value of [1] when the digital image signal data D0 is not identified with the reference digital data RD0. Other exclusive OR circuits work in the same manner. Therefore, when the digital image signal data D2–D5 are identified with all the bit data of the reference digital data RD2–RD5, the logical values of the exclusive OR circuits 18-1, - - - 18-4 are all [0]. Thus, the NOR circuit 19 outputs the logical value of 1 as the identification detection signal.

The gate transistors 20A, 21A turn on based on the identification detection signal [1] described above and outputs the step voltage pair VSL, VSH corresponding to the digital image signal data D2–D5. This enables the digital-analog conversion on the upper four bits of the digital image signal D0–D5.

Figure 11:
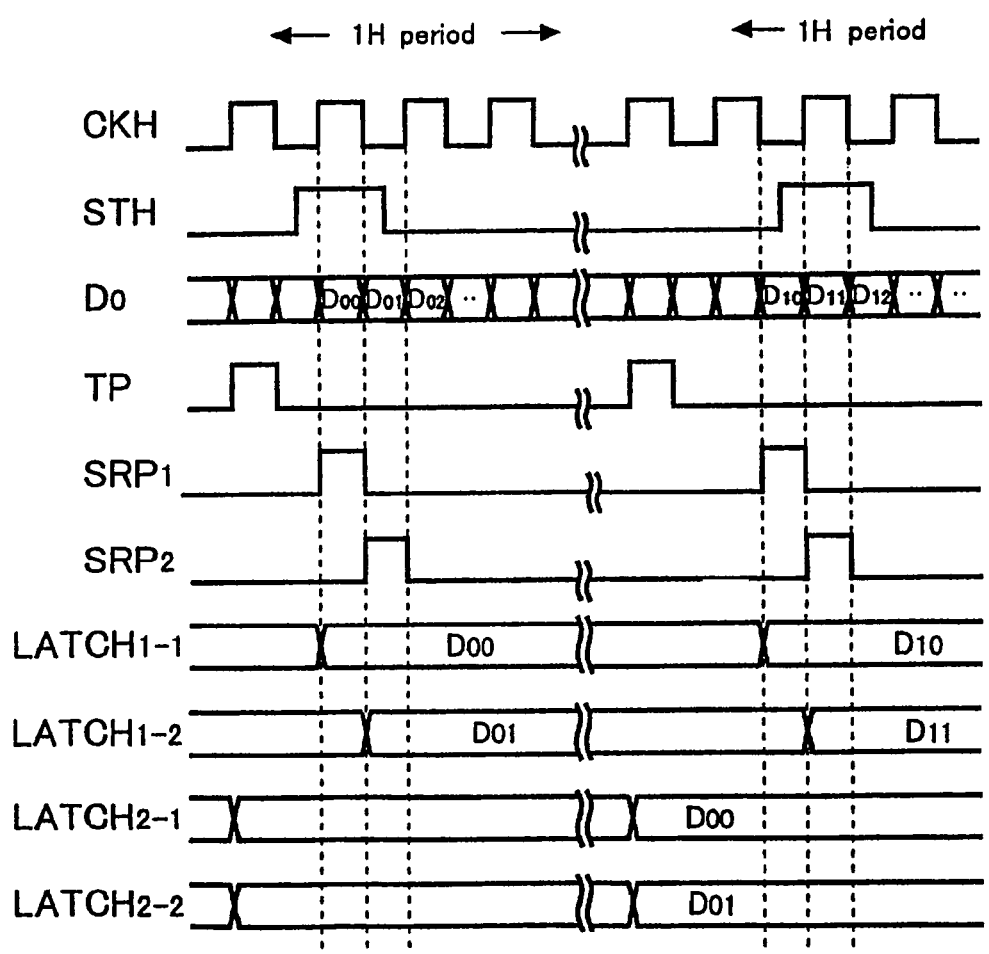
FIG. 11 is a timing chart showing an operation of the prior art liquid crystal display.

Next, the operation timing of the display device described above will be explained. The operation timing is the same as the conventional display device shown in FIG. 11 until the second latch circuit 14 latches the digital image signal. Then, the pixel element transistor 72 turns on because the gate signal line 51 is provided with the scanning signal G1 (high-level) for one horizontal period. Thus, the reference data generating circuit 15 outputs the reference digital data RD2–RD5 and the step voltage generating circuit 16 outputs the step voltage pair VSL, VSH, which is synchronized with the reference digital data.

While the digital image signal data D2–D5 are identified with the reference digital data RD2–RD5, the gate transistors 20A and 21A turn on, outputting the step voltage pair VSL, VSH corresponding to the digital image signal data D2–D5. Therefore, the step voltage pair VSL, VSH is supplied to the second DA converter disposed within the pixel element as the voltage pair VL, VH mentioned in the first embodiment. That is, this embodiment differs from the first embodiment in the configuration of the first DA converter. The same circuits shown in FIGS. 3 and 4 can be used as the second DA converter to be disposed within the pixel element for performing DA conversion on the remaining two bits.

The first DA converter described above enables the reduction of wiring and transistor elements, compared to the DA converter of the first embodiment with the decoding circuit.

The display device of the first and second embodiments described above has a six-bit DA converter. The allocation of the bit between the first DA converter and the second DA converter is not limited to that of the abovementioned embodiments. For example, it is possible that the first DA converter performs the DA conversion on three bits and the second DA converter performs the DA conversion on the remaining three bits. Also, the number of the bits of the DA conversion is not limited to six, and can be increased or decreased according to the necessity.

The display device described above is for black-and-white display. However, this invention is also applicable to the display device fro full-color display. In this case, the first latch circuit 13, the second latch circuit 14 and the DA converter should be disposed for each digital image signal of R, G, or B.

Although this embodiment is applied to the liquid crystal display device of the voltage control type, it is also applicable to the electro luminescence display device of electric current control type. In this case, the EL element and the driver transistor of the EL element should be employed instead of the liquid crystal 21. That is, the analog voltage, on which the DA conversion has already been performed, is provided to the gate of the driver transistor. The driver transistor controls the electric current going through the EL element based on the analog voltage, obtaining the electro luminescence display.

The display device of this invention has two DA converters for converting the digital image signal to the analog image signal; the first DA converter disposed in the peripheral area of a plurality of the pixel elements and the second DA converter disposed within each of the pixel elements. The first DA converter converts the m-bit portion of the n-bit digital image signal and the second DA converter converts the (n–m)-bit portion of the digital image signal.

This enables the simplification of the peripheral circuits of the pixel element, preventing size increase of the framing area of the display panel, while achieving the multiple-depth display by increasing the number of the bits of the DA converter.

What is claimed is:

1. A display device comprising:
   a plurality of pixel elements;
   a first DA converter disposed in a peripheral area of the pixel elements; and
   a second DA converter disposed within each of the pixel elements,
   wherein the first DA converter performs DA conversion on an m-bit portion of an n-bit digital image signal and the second DA converter performs DA conversion on a remaining (n–m)-bit portion of the digital image signal, a display image being formed by an analog image signal that is converted from the digital image signal by the first and second DA converters,
   the first DA converter comprises a reference voltage generating circuit generating a plurality of reference voltages based on the m-bit portion of the digital image signal, and a reference voltage selection circuit selecting a corresponding reference voltage pair from the plurality of the reference voltages based on the m-bit portion of the digital image signal, and the second DA converter comprises a plurality of capacitors each corresponding to a weighted capacitance value, a voltage supply circuit selectively supplying the reference voltage pair to electrodes of the plurality of the capacitors, and a charge transfer transistor supplying charges accumulated in the plurality of the capacitors to a pixel element electrode or a gate electrode of a driver transistor driving an electroluminescent element based on a timing signal.

2. The display device of claim 1, further comprising a pixel element selection transistor supplying the voltages from the voltage supply circuit to the electrodes of the plurality of the capacitors based on a scanning signal.

3. The display device of claim 1, further comprising a first latch circuit for latching the digital image signal based on a sampling pulse and a second latch circuit for latching an output of the first latch circuit based on a transfer pulse generated after one horizontal period, an output of the second latch circuit being inputted to the first DA converter.

4. A display device comprising:
a plurality of pixel elements;
a first DA converter disposed in a peripheral area of the pixel elements; and
a second DA converter disposed within each of the pixel elements,
wherein the first DA converter performs DA conversion on an n-bit portion of an n-bit digital image signal and the second DA converter performs DA conversion on a remaining (n–m)-bit portion of the digital image signal, a display image being formed by an analog image signal that is converted from the digital image signal by the first and second DA converters,
the first DA converter comprises a reference data generating circuit sequentially generating reference digital data of n-bit with an increment, a step voltage generating circuit generating a step voltage pair that changes in synchronization with a change of the reference digital data and that corresponds to the reference digital data, an identification detection circuit detecting a matching of the digital image signal and the reference digital data and outputting an identification detection signal, and a gate circuit outputting the step voltage pair based on the identification detection signal.

5. The display device of claim 4, further comprising a first latch circuit for latching the digital image signal based on a sampling pulse and a second latch circuit for latching an output of the first latch circuit based on a transfer pulse generated after one horizontal period, an output of the second latch circuit being inputted to the first DA converter.

6. The display device of claim 4 or claim 5, wherein the second DA converter comprises a ladder resistance circuit generating a plurality of voltages between voltages of the step voltage pair and a voltage selection circuit selecting one voltage from the plurality of the voltages based on the (n–m)-bit portion of the digital image signal.

7. The display device of claim 6, further comprising a pixel element selection transistor supplying the voltage selected by the voltage selection circuit to a pixel element electrode of one of the pixel elements based on a scanning signal.

8. The display device of claim 4 or claim 5, wherein the second DA converter has a plurality of capacitors each corresponding to a capacitance value, a voltage supply circuit selectively supplying the step voltage pair to electrodes of the plurality of the capacitors, and a charge transfer transistor supplying charges accumulated in the plurality of the capacitors to a pixel element electrode of one of the pixel elements based on a timing signal.

9. The display device of claim 8, further comprising a pixel element selection transistor supplying the voltage from the voltage supply circuit to the electrodes of the plurality of the capacitors based on a scanning signal.

* * * * *